United States Patent [19]

Lacey et al.

[11] Patent Number: 6,130,842
[45] Date of Patent: Oct. 10, 2000

[54] ADJUSTABLE VERIFY AND PROGRAM VOLTAGES IN PROGRAMMABLE DEVICES

[75] Inventors: Timothy M. Lacey, Cupertino; Khaldoon Abugharbieh, Sunnyvale, both of Calif.

[73] Assignee: Cypress Semiconductor Corporation, San Jose, Calif.

[21] Appl. No.: 08/908,861

[22] Filed: Aug. 8, 1997

[51] Int. Cl.[7] .................................................. G11C 29/00
[52] U.S. Cl. ............................... 365/185.24; 365/185.18; 365/201
[58] Field of Search ................................. 326/38, 39, 41; 365/189.09, 201, 185.24, 185.18

[56] References Cited

U.S. PATENT DOCUMENTS

| | | | |
|---|---|---|---|
| 4,380,804 | 4/1983 | Lockwood et al. | 365/184 |
| 4,648,076 | 3/1987 | Schrenk | 365/230 |
| 4,710,927 | 12/1987 | Miller | 371/15 |
| 5,006,974 | 4/1991 | Kazerounian et al. | 363/60 |
| 5,335,198 | 8/1994 | Van Buskirk et al. | 365/185.3 |
| 5,602,494 | 2/1997 | Sundstrom | 326/39 |
| 5,691,664 | 11/1997 | Anderson et al. | 326/38 |
| 5,805,607 | 9/1998 | Khu | 326/39 |

OTHER PUBLICATIONS

Advanced Information Data Sheet Ultra39512 UltraLogic™ 512–Marcocell CPLD, Document # 38–00470, Fax ID: 6134 (1995).
Advanced Information Data Sheet Ultra39384 Ultra Logic™ 384–Marcocell CPLD, Document # 38–00472, Fax ID: 6143 (1995).
Advanced Information Data Sheet Ultra39256 UltraLogic™ 256–Marcocell CPLD, Document # 38–00474, Fax ID: 6133 (1995).
Advanced Information Data Sheet Ultra39192 Ultra Logic™ 192–Marcocell CPLD, Document # 38–00473, Fax ID : 6131 (1995).
Advanced Information Data Sheet Ultra39000 UltraLogic™ High–Density CPLD Family, Document # 38–00475, Fax ID: 6141 pp. 1–2 (1995).
Test Technology Standards Committee of the IEEE Computer Society, "IEEE Standard Test Access Port and Boundary–Scan Architecture", pp.i–xvii, 1–1—12–6 & A–1–A–12 (1993).

*Primary Examiner*—Don Wong
*Assistant Examiner*—Wilson Lee
*Attorney, Agent, or Firm*—Wagner, Murabito & Hao LLP

[57] ABSTRACT

A voltage source is configured to produce a desired voltage and the desired voltage is applied to a programmable cell coupled to the voltage source. Configuration may be accomplished by loading a register with a programmed voltage value which may be received as a serial data stream through a test access port coupled to the register. For one embodiment, the voltage source may be coupled to a gate of the programmable cell, thus allowing testing of margin voltages of the programmable cell. In a further embodiment, the voltage source may be coupled to a drain of the programmable cell through a load line circuit, thus providing a programmed voltage for the programmable cell. In general then, the programmable voltage source is configurable to provide a voltage to the programmable cell in accordance with a programmed voltage value loaded into the programmable voltage source. The present invention may be embodied in a programmable device such as a PLD a CPLD or an FPGA and provides easily adjustable verify and/or program voltages, configurable through use of the programmable register, to test the operation of the programmable cell. The higher the bit count of the register, the more precise a verify and/or program voltage that may be provided.

15 Claims, 7 Drawing Sheets

ADJUSTABLE VERIFY AND PROGRAM VOLTAGES IN PROGRAMMABLE DEVICES

FIELD OF THE INVENTION

The present invention relates to programmable devices and, in particular, to the verify and program voltages in such devices.

BACKGROUND

Programmable devices such as erasable programmable read only memories (EPROMs), flash memories, field programmable gate arrays (FPGA), programmable logic devices (PLD) and complex programmable logic devices (CPLD) often use programmable cells to store logic configurations. For example, PLDs and/or CPLDs may use erasable programmable read only memory (EPROM) cells to configure logic cells within the device. Alternatively, electrically erasable programmable read only memory (EEPROM) or flash memory cells may be used for these purposes. In general, these programmable cells have electrically isolated gates (floating gates) which may be used to store information in the form of charge, even in the absence of an operating voltage. In this way, a memory cell may be programmed, or not, to store a desired logic state.

Verifying the margin voltage of a programmable cell becomes important for such programmable devices. Margin voltages help determine the life and the reliability of a cell and, in addition, can determine the maximum operating voltage (Vcc) that a part (e.g., a PLD, CPLD or an FPGA) containing the cell can be operated at. During normal operation, a voltage is applied to the gate of a selected cell, usually Vcc (e.g., 0–4V). During margin mode or verify mode, a verify voltage is applied to the gate of the cell to determine if the cell retains its memory state. By checking a programmed cell above the normal operating voltage, one can guarantee that it will function under worst case conditions for the life of the device. FIG. 1 illustrates a prior scheme used to determine margins voltages for such programmable cells. Generally, a programmable cell 10 is provided with a verify voltage which may be produced by a voltage divider network 12. The verify voltage will be some fraction of a reference voltage Vpp 14. Selected fractions of the reference voltage can be applied through voltage divider network 12 to programmable cell 10 and the state of programmable cell 10 determined using a conventional sense amplifier 16.

In general, such a scheme provided for only three, hardwired voltage levels to be applied as verify voltages. For example, a high voltage (e.g., 6.8V), corresponding to a significant fraction of the reference voltage, a low voltage (e.g., 3.5V), corresponding to a relatively small fraction of the reference voltage and a nominal voltage (e.g., 6.5V), corresponding to some intermediate fraction of the reference voltage between the high and low voltages. The high voltage ($^V$verify-high) is used to check each cell as each cell is being programmed. The nominal voltage ($^V$verify-nom) is used to check all of the cells after the part has been programmed and is the minimum voltage necessary to guarantee a reliably programmed cell. The low voltage ($^V$verify-low) is used to check the erased cells. Thus, the scheme is relatively inflexible and provides a minimal amount of information. In addition, new silicon masks are required to produce different verify voltages.

Another important parameter for programmable devices is the voltage at which programmable cells within the device are to be programmed. In general, programmable cells are programmed by applying a programming voltage to the drain of the programmable cell through a load line circuit as shown in FIG. 2. Load line circuit 20 provides programmable cell 22 with a programming voltage from a voltage source 24. This programming voltage must be within a certain window of voltages across various process corners and voltage source conditions. To provide this voltage, a reference voltage circuit 26 may apply some fraction of the voltage 24 to load line circuit 20 for programming the programmable cell 22. However, because the load line circuit is inflexible, any changes in process parameters (e.g., as may be encountered when migrating to new process technologies) required a new silicon mask to produce a different optimum reference voltage circuit.

SUMMARY OF THE INVENTION

In one embodiment, the present invention provides a method which includes configuring (e.g., by programming) a voltage source to produce a desired voltage and applying the desired voltage to a programmable cell coupled to the voltage source. Programming the voltage source may be accomplished by loading a register with a programmed voltage value which may be received as a serial data stream through a test access port coupled to the register. For one embodiment, the voltage source may be coupled to a gate of the programmable cell, thus allowing testing of margin voltages of the programmable cell. In a further embodiment, the voltage source may be coupled to a drain of the programmable cell through a load line circuit, thus providing an optimum program voltage of the programmable cell.

In a further embodiment, the present invention provides a circuit which includes a programmable voltage source and a programmable cell coupled thereto. The programmable voltage source may be coupled to a gate of the programmable cell or, alternatively, may be coupled to a drain of the programmable cell through a load line circuit. The programmable voltage source may include a register coupled to a voltage divider network. The register may be accessible through a test access port or may configured to be loaded with a predetermined bit pattern, for example upon power up. In general then, the programmable voltage source is configurable to provide a desired voltage to the programmable cell in accordance with a programmed voltage value loaded into the register.

In one embodiment, the present invention may be included in a programmable device (e.g., an FPGA, a CPLD or a PLD). The present invention thus provides easily adjustable verify voltages, configurable through use of the programmable register, to test operation of the programmable cell. For an embodiment where the programmable register is accessible through a test access port which complies with the JTAG standard, the programmable register may be loaded using the JTAG state machine with the value that determines the verify voltage. The higher the bit count of the register, the more precise the verify voltage that may be provided. In an alternative embodiment, where the programmable voltage source is coupled to the drain of the programmable cell, the register may be loaded with a value to provide a drain (i.e., program) voltage to be provided to the programmable cell. Thus, the drain voltage can be kept within a required programming box across various process corners and voltage source conditions.

BRIEF DESCRIPTION OF THE DRAWINGS

The present invention is illustrated by way of example, and not limitation, in the figures of the accompanying drawings in which.

DETAILED DESCRIPTION

Described herein are methods and apparatus for providing adjustable verify and program voltages for programmable cells of a programmable device. In one embodiment, the present invention provides a method which includes configuring a voltage source to produce a desired voltage and applying the desired voltage to a programmable cell coupled to the voltage source. Configuring the voltage source may be accomplished by loading a register with a programmed voltage value. Such a programmed voltage value may be received as a serial data stream through a test access port coupled to the register or may be provided as a predetermined bit pattern, e.g., from a series of read only memory (ROM) cells or read/write memory (RAM) cells configured to power up in a preferred state. For one embodiment, the voltage source may be coupled to a gate of the programmable cell, thus allowing testing of margin voltages of the programmable cell. In a further embodiment, the voltage source may be coupled to a drain of the programmable cell through a load line circuit, thus providing a program voltage of the programmable cell.

In a further embodiment, the present invention provides a circuit which includes a programmable voltage source and a programmable cell coupled thereto. The programmable voltage source may be coupled to a gate of the programmable cell or, alternatively, may be coupled to a drain of the programmable cell through a load line circuit. The programmable voltage source may include a register coupled to a voltage divider network. The register may be accessible through a test access port or may configured to be loaded with a predetermined bit pattern, for example upon power up. In general then, the programmable voltage source is configurable to provide a voltage to the programmable cell in accordance with a programmed voltage value loaded into the register.

The present invention may be embodied in a programmable device, e.g., an EPROM, EEPROM or flash memory or a PLD, CPLD or an FPGA, and provides easily adjustable verify and/or program voltages, configurable through use of the programmable register, to test or program operation of one or more programmable cells of such a device. For an embodiment where the programmable register is accessible through a test access port which complies with the IEEE Standard Test Access Port and Boundary-Scan Architecture defined in IEEE Std. 1149.1-1990 or IEEE Std. 1149.1a-1993 (hereafter the "JTAG standard"), the programmable register may be loaded using a JTAG state machine with the value that determines the verify and/or program voltages. The higher the bit count of the register, the more precise the verify and/or program voltage(s) that may be provided.

Figure 1:
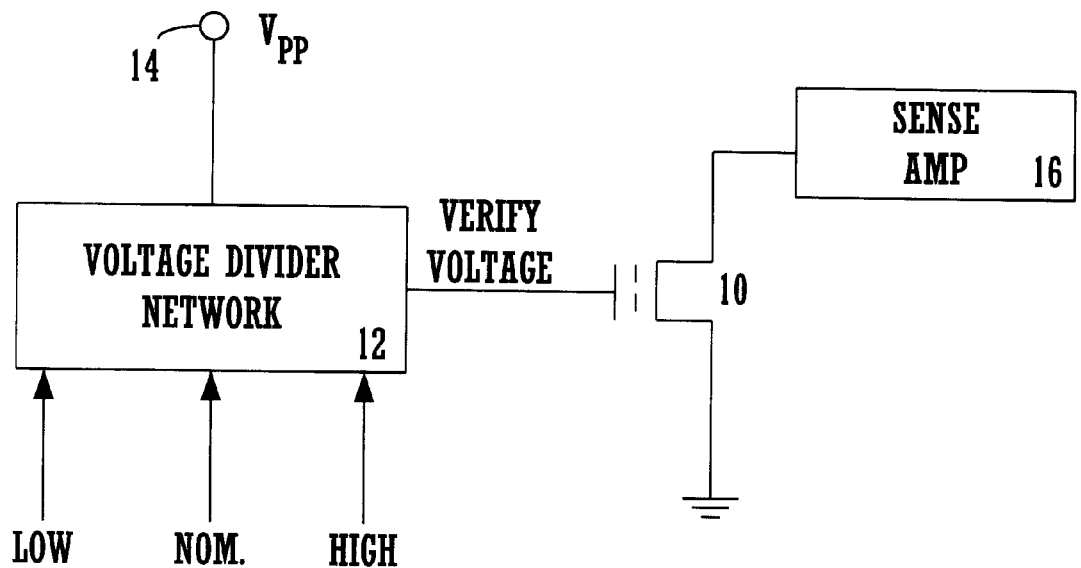
FIG. 1 illustrates a conventional scheme to test margin voltages of a programmable cell.
Figure 2:
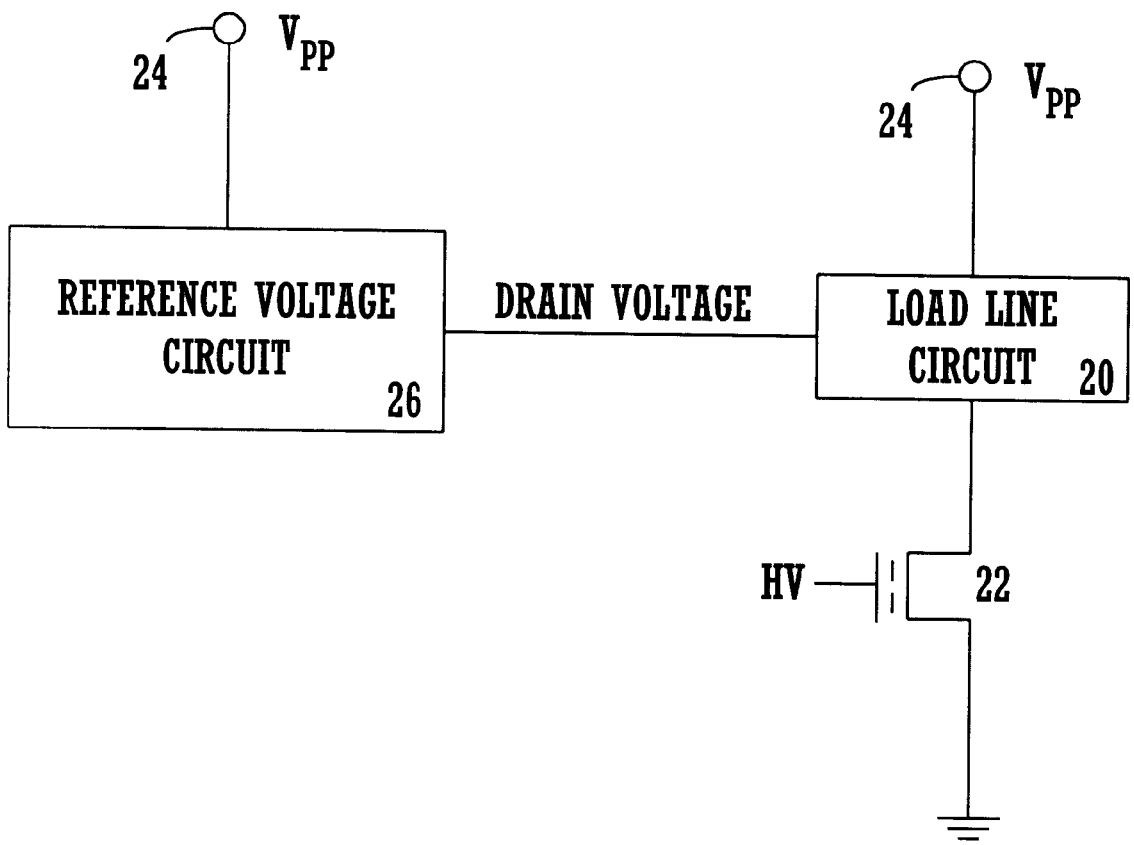
FIG. 2 illustrates a conventional scheme to provide a programming voltage of a programmable cell.
Figure 3:
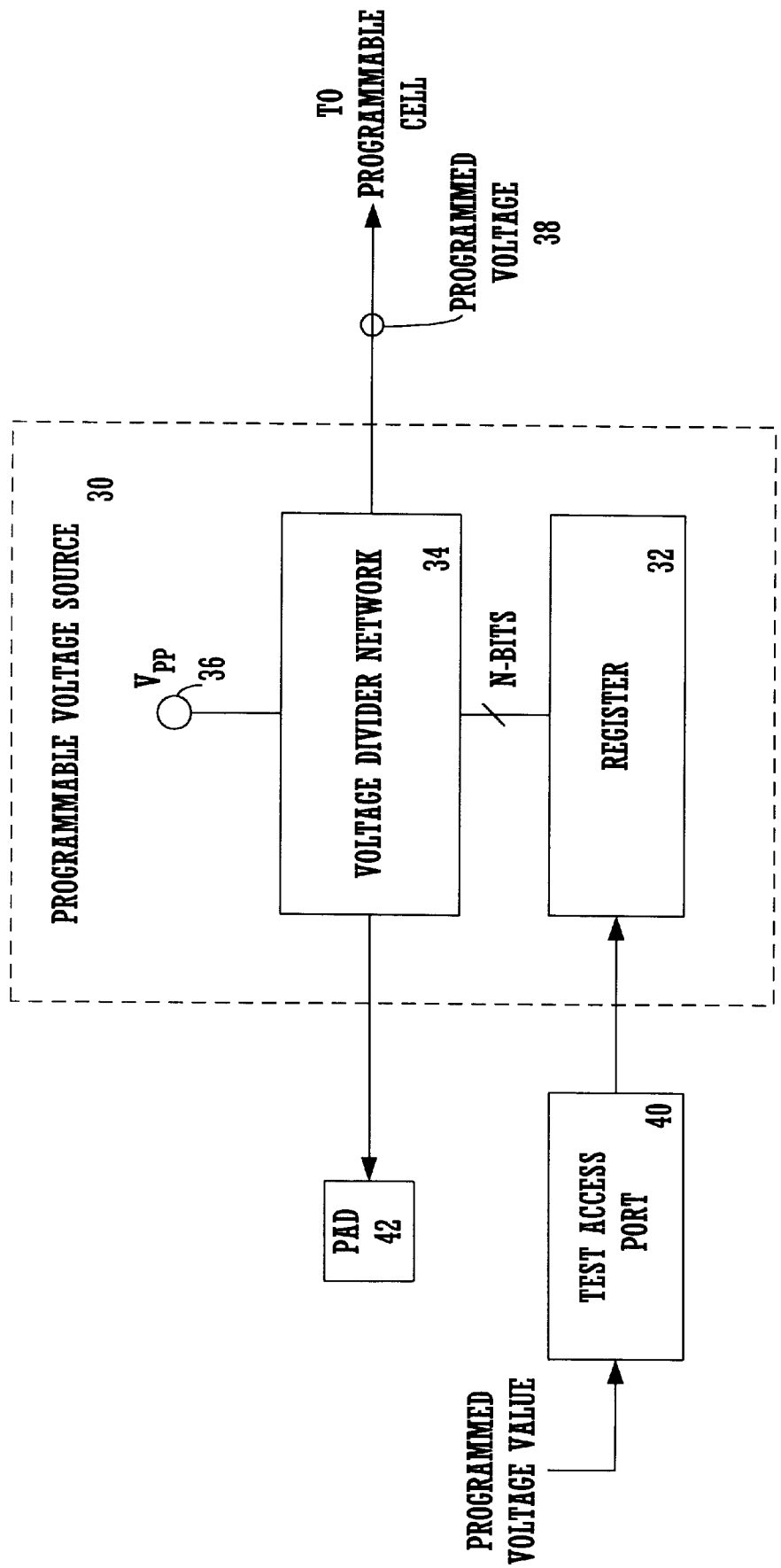
FIG. 3 illustrates a programmable voltage source for use in programming and testing operations of a programmable cell in accordance with one embodiment of the present invention.

FIG. 3 illustrates one embodiment of a programmable voltage source which allows such adjustable verify or program voltages for programmable cells of a programmable device. Programmable voltage source 30 is configurable to provide a voltage to a programmable cell in accordance with a programmed voltage value. For this embodiment, the programmed voltage value may be loaded into a register 32 which is part of programmable voltage source 30. A voltage divider network 34, which receives a reference voltage 36, e.g., Vpp which may be 12 volts or another high voltage potential, is coupled to register 32 and provides a programmed voltage 38 to a programmable cell in accordance with the programmed voltage value loaded in register 32. As will be further described below, the programmed voltage 38 may be used to test margin or program voltages of the programmable cell.

The program voltage value which is loaded in register 32 may come from a variety of sources. For example, register 32 may comprise a plurality (N-bits) of random access memory (RAM) and/or read only memory (ROM) cells which are configured to power up in preferred states, thereby providing a predetermined bit pattern which may be used to set the programmed voltage 38 in voltage divider network 34. Alternatively, as illustrated in FIG. 3, register 32 may be loaded through a test access port 40. Test access port 40 may be a serial or parallel port and data provided through port 40 may be serially shifted into register 32 (e.g., where test access port 40 is a serial port) or loaded in parallel, (e.g., where test access port 40 is a parallel port). The programmed voltage 38 provided by voltage divider network 34 may be checked at pad 42, which may be coupled to a external pin of a programmable device which includes programmable voltage source 30.

Notice that because voltage divider network 34 provides programmed voltage 38 according to the programmed voltage value loaded in register 32, the higher the bit count of register 32, the more precise the verify and/or program voltage(s) that may be provided to the programmable cell. For example, if register 32 is a 3-bit register, up to eight different programmed voltages 38 may be provided. If register 32 is a 4-bit register, up to sixteen different programmed voltages 38 may be provided, and so on. Therefore, depending on the precision required for various applications, register 32 may be configured as an N-bit register, where $2^N$ various programmed voltages may be provided according thereto. For most applications, a three or four bit register should be sufficient, however, the generality of the present invention should in no way be limited to such embodiments, which are merely design/implementation choices.

Figure 4:
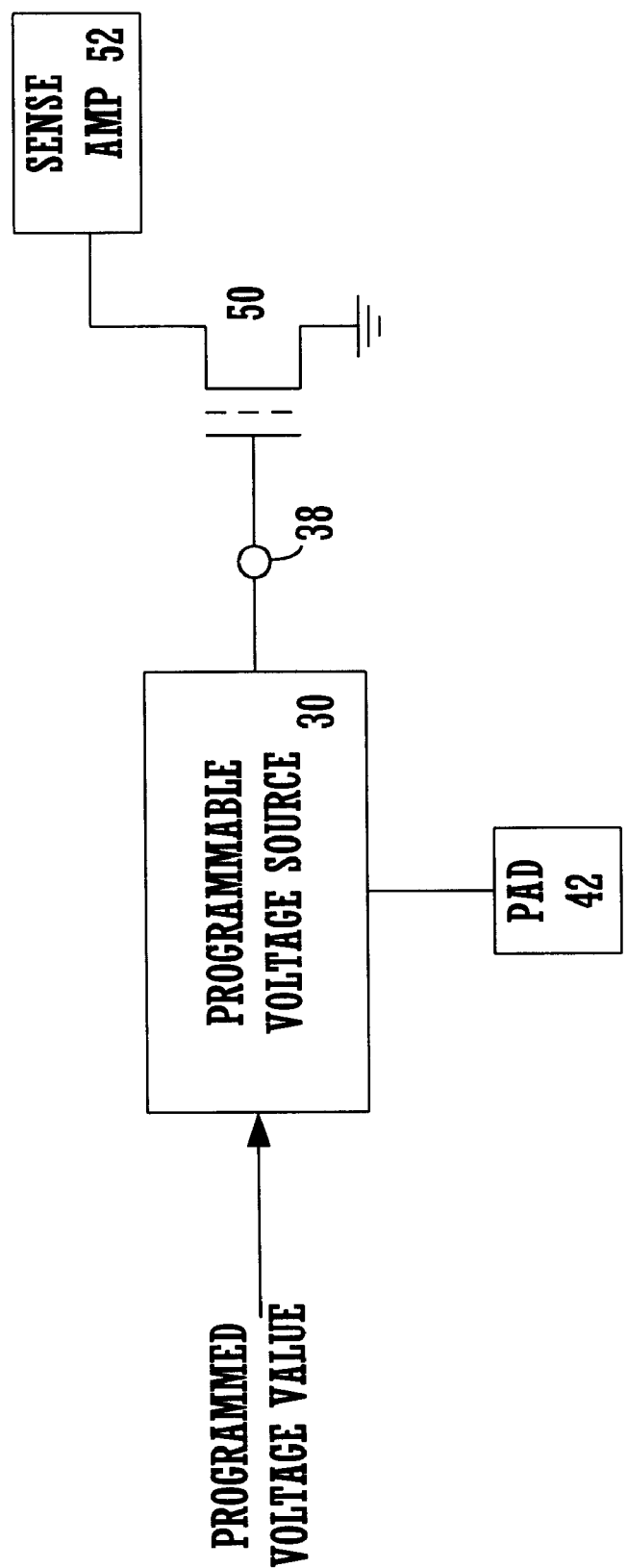
FIG. 4 illustrates the use of a programmable voltage source to determine margin voltages of a programmable cell in accordance with an embodiment of the present invention.

FIG. 4 illustrates the use of programmable voltage source 30 to provide margin voltages of a programmable cell 50. For this embodiment, the programmed voltage 38 is applied to the control gate of programmable cell 50 and the state (e.g., programmed or not programmed) of programmable cell 50 may be tested through a sense amplifier 52 in the conventional fashion.

For such an embodiment, testing would be accomplished post-manufacture. For example, a manufacturer may wish to test whether some or all of the programmable cells 50 of a programmable device program properly (i.e., to determine whether the cells switch from a logic 0 to a logic 1 state at a certain voltage). To accomplish this task, various programmed voltage values may be loaded into the programmable voltage source 30 and the resulting programmed voltage 38 applied to the control gate of one or more programmable cells 50. The programmed voltage level may be determined by measuring the voltage at pad 42 (or at an external pin connected thereto) and the state of the programmable cell(s) 50 (i.e., programmed or not programmed) tested using sense amplifier 52. When it is determined that a certain programmed voltage accomplishes reliable programming of the programmable cell(s) 50, this value (again read at pad 42) may be compared to the device specifications to determine whether the process that has produced the programmable cells and or the entire programmable device has achieved acceptable results. By allowing programmable voltage source 30 to provide many programmed voltages 38, no design changes (i.e., no new masking processes to develop a new reference voltage source) were required to accomplish this testing. Further, the dynamic range provided by the programmable voltage source 30 is improved over the fixed, three voltages which were achieved by prior systems and, therefore, the margin voltage of the programmable cell(s) 50 may be determined to much greater accuracy.

The programmable voltage source 30 may also be used to provide an optimum program (or drain) voltage for a given load line circuit/programmable cell combination. As indicated above, programmable cells such as EPROMs generally include electrically isolated gates (floating gates) which may be used to store information in the form of charge. The EPROM cell is thus programmed by placing a charge on the floating gate. During a programming operation, a programming voltage which is channeled through a load line circuit is applied to the drain of the EPROM cell. The programming voltage generates a programming current that flows through the drain of the EPROM cell, thereby accelerating electrons through the channel of the cell. Simultaneously, a large positive voltage (greater than the drain voltage) is applied to the control gate of the EPROM cell, thereby establishing an electric field in the isolating oxide of the cell. This electric field attracts the hot electrons and accelerates them towards the floating gate. In this way, the floating gate is charged, and the charge that accumulates on it becomes trapped, thus programming the cell. Flash memory cells and EEPROM cells are similarly programmed, i.e., by storing charge on a floating gate, but may take advantage of Fowler-Nordheim tunneling to transport electrons on the floating gate during programming operations.

Due to physical and functional limitations of programmable cells, the programming current must be controlled within certain operating parameters. These physical and functional limitations define a load line "box" within which the current through the cell and the voltage across the source/drain current path of the cell must remain in order to ensure the proper programming of the cell. In other words, the load line "box" is the voltage/current region where a cell can successfully be programmed. The load line box is defined by four points: the minimum source-to-drain voltage/current for fast cells to program, the minimum source-to-drain voltage/current for slow cells to program, the maximum source-to-drain voltage/current to prevent fast cells from snapping back, and the maximum drain-to-source voltage/current that would not cause charge loss. Therefore, in order to ensure proper programming of the cells in a programmable device without latch-up or charge loss, the load line circuit must provide a load line (or resistance) which operates within a defined load line box. Alternatively, for a given load line circuit resistance, it is important to determine the correct drain voltage which will provide optimum programming for programmable cells connected thereto.

Figure 5:
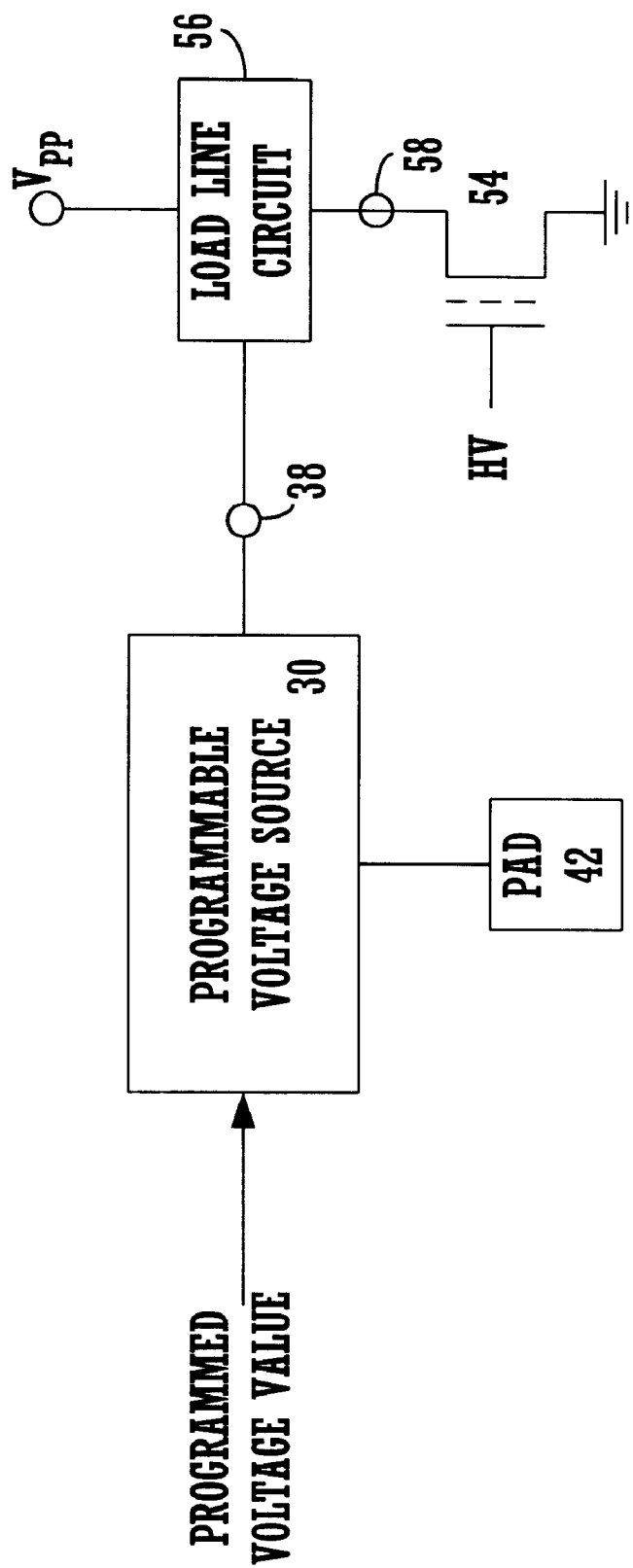
FIG. 5 illustrates the use of a programmable voltage source to provide programming voltages of a programmable cell in accordance with a further embodiment of the present invention.

FIG. 5 illustrates the use of programmable voltage source 30 to provide the program (or drain) voltage for programmable cell(s) 54. In this embodiment, the programmed voltage 38 is applied to a load line circuit 56 and the resulting drain voltage 58 is applied to the drain of programmable cell 54. Again, testing may be performed post-manufacture, e.g., to determine optimum program voltages for programmable cells produced according to a new process or to test various lots or batches of programmable devices. To accomplish this task, various programmed voltage values may be loaded into the programmable voltage source 30 and the resulting programmed voltage 38 applied to the load line circuit 56. Load line circuit 56 then produces a drain voltage 58 which is applied to programmable cell 54. The cell may then be tested (e.g., using a conventional sense amplifier) to determine whether it successfully programmed or not. The programmed voltage level may be determined by measuring the voltage at pad 42 (or at an external pin connected thereto). When it is determined that a certain programmed voltage accomplishes reliable programming of the programmable cell(s) 54, this value (again read at pad 42) may be compared to the device specifications to determine whether the process that has produced the programmable cells and or the entire programmable device has achieved acceptable results. By allowing programmable voltage source 30 to provide any programmed voltages 38, no design changes (i.e., no new masking processes to develop a new reference voltage source) are required to accomplish this testing.

Figure 6:
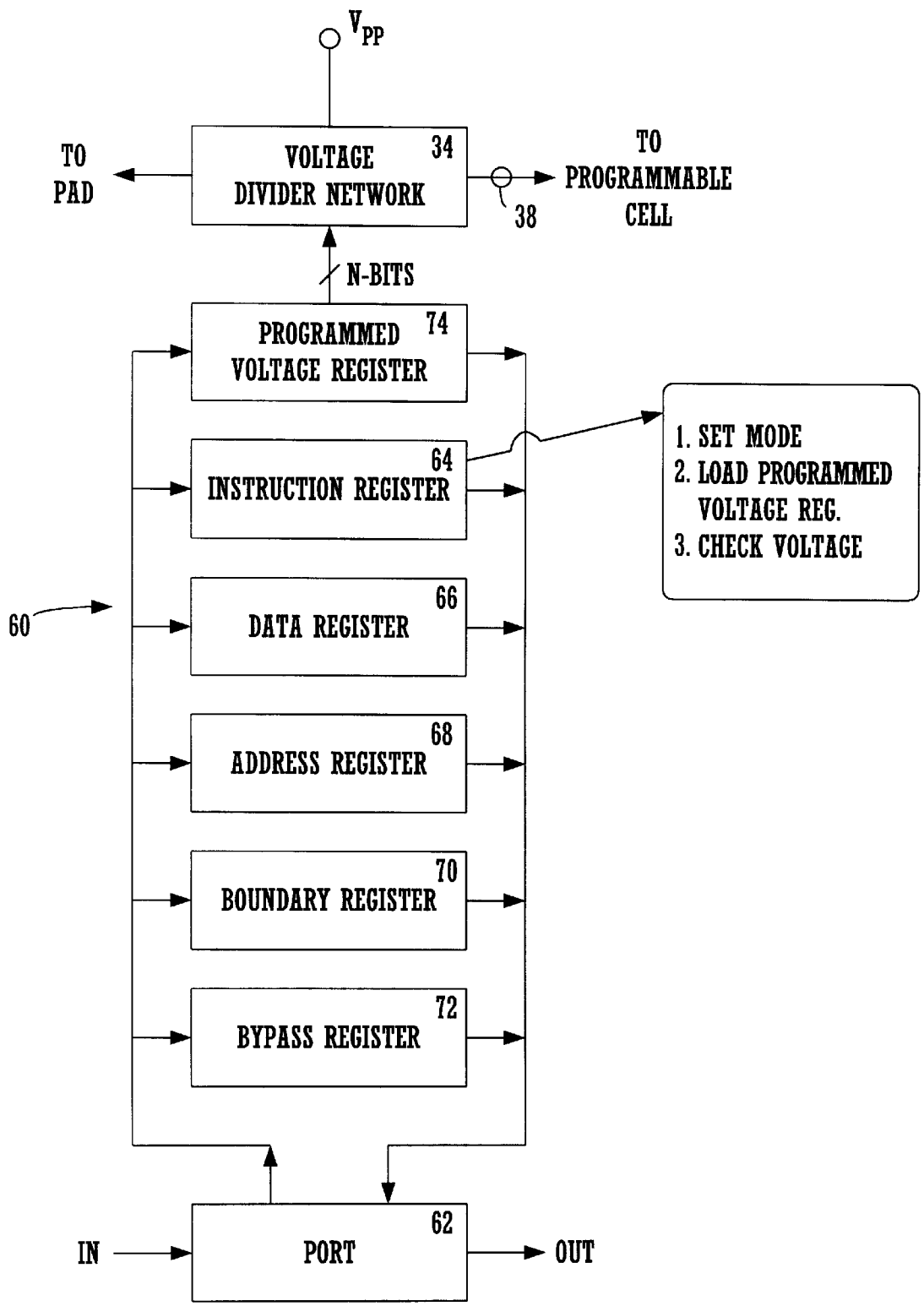
FIG. 6 illustrates a test access port including a programmed voltage register for use according to an embodiment of the present invention.

FIG. 6 illustrates one embodiment of a test access port 60 which may be used to load a programmed voltage value for the programmable voltage source. For this embodiment, the test access port 60 is a serial port which complies, at least in part, with the JTAG standard. In general, coupled to a port 62 are a number of registers 64–74. Instruction register 64, data register 66, address register 68, boundary register 70 and bypass register 72 all comply with such registers as defined in JTAG standard (which is herein incorporated by reference in its entirety) and perform functions as described therein. Of importance, instruction register 64 is adapted to receive instructions (i.e., serial bit patterns) from port 62 which may be decoded to provide (1) a set of test data registers that may operate while the instruction is current, and (2) a serial test data register path that is used to shift data within the device during an operation. In executing such instructions, the device (e.g., a PLD, CPLD or an FPGA) may operate in one of a number of modes. For example, the device may be configured to allow data to be shifted between various logic cells to determine whether the cells have been properly programmed to achieve a desired logic function. Such test operations are well known in the art and need not be further described here.

Programmed voltage register 74 is a new register, i.e., one not defined by the JTAG standard, which is part of test access port 60. Programmed voltage register 74 may be constructed in accordance with registers defined by the JTAG standard, e.g., a serial shift register that may be read in parallel. In general, programmed voltage register 60 may be loaded with a program voltage value be to applied to voltage divider network 34 through port 62. This value will determine a program voltage 38 which is produced by voltage divider network 34.

To allow operation of the circuit illustrated in FIG. 6, a new instruction is defined which allows a programmed voltage value to be loaded into programmed voltage register 74. This instruction (or a series of further instructions) may then allow the programmed voltage value loaded in register 74 to be applied to voltage divider network 34 so that the programmed voltage 38 is produced (note, depending on the implementation of voltage divider network 34, this function may occur automatically, without need for a further instruction). Thus, instruction register 64 may be loaded through port 62 with a bit stream that will set a desired mode for the device. For example, a verify voltage mode or a programmed voltage mode may be set. Once the appropriate mode has been set, the programmed voltage value is loaded into register 74 through port 62 and applied to voltage divider network 34 to obtain the desired programmed voltage 38. This voltage can be applied to a programmable cell and can further be checked at an external pad as described above. Successive series of programmed voltage values may be loaded in programmed voltage register 74 until desired operating conditions of the programmable cell are met.

Figure 7:
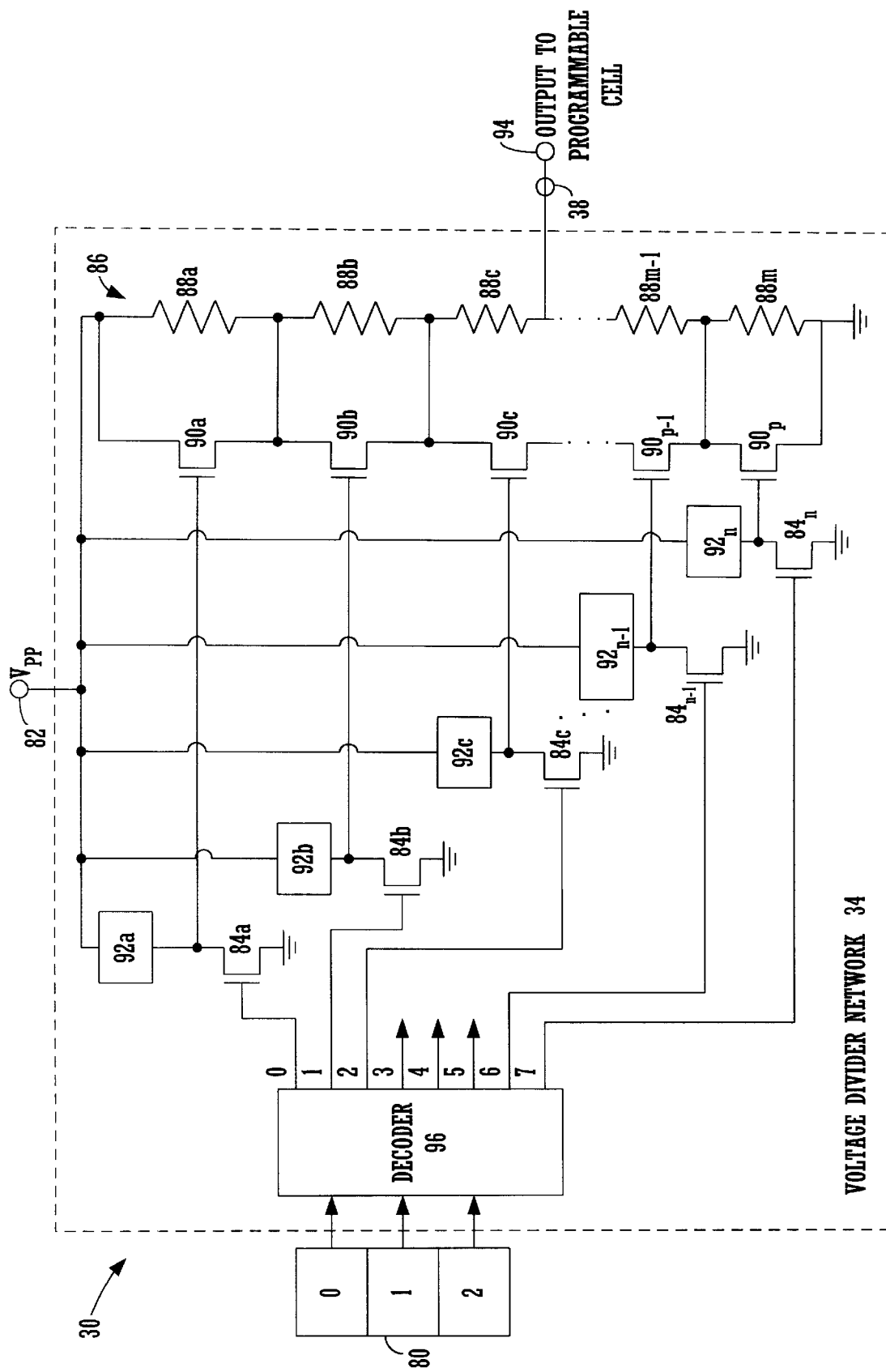
FIG. 7 illustrates a programmable voltage source according to one embodiment of the present invention.

FIG. 7 illustrates one possible configuration of programmable voltage source 30. Programmable voltage source 30 includes register 80 (shown here as a 3-bit register, however, in general register 80 may have 1-N bits, depending on a desired granularity for testing or programming operations) and voltage divider network 34. Voltage divider network 34 receives as inputs a programmed voltage value from register 80 and a reference voltage (e.g., Vpp) 82. The value stored in register 80 (i.e., the programmed voltage value) may be applied through a decoder 96 as electrical signals to the gates of transistors 84a–84n to control the operation of resistor network 86. That is, register 80 may be configured to provide logic 1 or logic 0 signals to the gates of transistors 84a–84n to set (or not set) "taps" on resistor network 86. In other embodiments, decoder 96 may be eliminated and the gates of transistors 84a–84n may be under the direct control of register 80. In still further embodiments, other sizes of decoders may be used for different sizes of register 80 (e.g., a 4-to-16 decoder may be used where register 80 is a 4-bit register).

Resistor network 86 includes resistors 88a–88m which may be coupled into or out of a voltage path to an output node 94, according to the activation (or not) of transistors 90a–90p. Transistors 90b–90p are under the control of transistors 84a–84n and, thus, may be selected or not depending upon the bit pattern loaded in register 80 (i.e., the programmed voltage value). High voltage pull up devices 92a–92n are used to bias transistors 84a–84n. In operation, then, if the value loaded in register 80 is such that transistor 84a is off, transistor 90a will be turned on, thus removing resistor 88a from the voltage path from reference voltage source 82 to output node 94. Conversely, if the value loaded in register 80 is such that transfer 84a is on, transistor 90a will be off and resistor 88a will be included in the voltage path from voltage source 82 to output node 94. Similarly, other resistors in resistor network 86 may be switched into or out of the voltage path, thus providing a desired programmed voltage 38 at output node 94.

Thus, methods and apparatus for adjusting verify and program voltages in programmable devices have been described. Although described with reference with certain specific illustrated embodiments, the present invention may be implanted in a variety of fashions. For example, instead of a programmable register, predetermined bit patterns stored in ROM cells may be used. Thus, the present invention should only be limited in terms of claims which follow.

What is claimed is:

1. A method for determining the margin voltage of a programmable cell, said method comprising the steps of:

a) configuring a voltage source, wherein said voltage source is coupled to a gate of a programmable cell, in accordance with a programmed voltage value received at a register to produce a desired voltage;

b) applying said desired voltage to said programmable cell; and c) determining a margin voltage of said programmable cell.

2. A method as in claim 1 wherein said step a) comprises loading said register with said programmed voltage value.

3. A method as in claim 2 wherein said loading of said register comprises receiving a serial data stream through a test access port coupled to said register.

4. A method as in claim 1 further comprising the step of:

d) sensing a state of said programmable cell after said step of b).

5. A method as in claim 1 further comprising the step of:

d) applying said desired voltage to a pad coupled to said voltage source.

6. A method for determining the programming voltage of a programmable cell, said method comprising the steps of:

a) loading a register coupled to a voltage source with a programmed voltage value;

b) configuring said voltage source, wherein said voltage source is coupled to a drain of a programmable cell, through a load line circuit in accordance with said programmed voltage value to produce a desired voltage;

c) applying said desired voltage to said programmable cell; and d) determining a programming voltage of said programmable cell.

7. A method as in claim 6 further comprising the step of:

e) applying said desired voltage to a pad coupled to said voltage source.

8. A circuit adapted to determine the margin voltage of a programmable cell, said circuit comprising:

a programmable voltage source;

a register coupled to said programmable voltage source; and a programmable cell including a gate, said gate of said programmable cell coupled to said programmable voltage source, said register and said programmable voltage source adapted to cooperatively produce a desired voltage and apply said desired voltage to said gate of said programmable cell such that a margin voltage of said programmable cell can be determined.

9. A circuit as in claim 8 further comprising:

a voltage divider network coupled to said register.

10. A circuit as in claim 8 further comprising:

a test access port coupled to said programmable voltage source, said register accessible through said test access port.

11. A circuit as in claim 8 wherein said programmable voltage source is configurable to provide said desired voltage to said programmable cell in accordance with said programmed voltage value loaded into said register.

12. A circuit as in claim 11 further comprising:

a test access port, said test access port coupled to said programmable voltage source and configured to receive said programmed voltage value.

13. A circuit adapted to determine the program voltage of a programmable cell, said circuit comprising:

a programmable voltage source, said programmable voltage source further comprising:

a register, said register coupled to receive a programmed voltage value; and a voltage divider network, said voltage divider network coupled to said register;

a load line circuit coupled to said programmable voltage source; and a programmable cell including a drain, said drain of said programmable cell coupled to said load line circuit, said programmable voltage source adapted to produce a desired voltage and apply said desired voltage to said drain of said programmable cell such that a program voltage of said programmable cell can be determined.

14. A circuit as in claim 13 further comprising:

a test access port coupled to said programmable voltage source, said register accessible through said test access port.

15. A programmable device comprising the circuit of claim 13.

* * * * *